United States Patent [19]

Hamp, III et al.

[11] Patent Number: 5,365,177
[45] Date of Patent: Nov. 15, 1994

[54] APPARATUS FOR MEASUREMENT OF HIGH FREQUENCY CORONA DISCHARGES IN ELECTRICAL COMPONENTS

[75] Inventors: Charles H. Hamp, III, Seattle, Wash.; David D. Maine, Brussels,

[73] Assignee: Honeywell Inc., Minneapolis, Minn.

[21] Appl. No.: 29,098

[22] Filed: Mar. 10, 1993

[51] Int. Cl.$^5$ .................... G01R 31/06; G01R 31/14
[52] U.S. Cl. .................... 324/547; 324/548; 324/551
[58] Field of Search ........... 324/527, 536, 541, 544, 324/546, 547, 548, 551, 552, 553, 95

[56] References Cited

U.S. PATENT DOCUMENTS

| | | |
|---|---|---|
| 3,015,774 | 1/1962 | Eigen . |
| 3,173,086 | 3/1965 | Kresge .................... 324/547 X |
| 3,430,136 | 2/1969 | Brustle et al. ............ 324/547 X |
| 3,609,737 | 9/1971 | Lustig et al. . |
| 3,611,122 | 10/1971 | Pahl, Jr. . |
| 3,612,992 | 10/1971 | Cronin .................... 324/536 X |
| 3,727,129 | 4/1973 | Hummert ................ 324/547 |
| 3,739,272 | 6/1973 | McKean . |
| 3,753,087 | 8/1973 | Tan ........................ 324/536 X |
| 3,801,899 | 4/1974 | Liao ....................... 324/547 X |
| 3,869,665 | 3/1975 | Kenmochi et al. ...... 324/536 X |
| 4,006,410 | 2/1977 | Roberts .................. 324/536 X |
| 4,064,454 | 12/1977 | Yoshino et al. ......... 324/547 |
| 4,095,173 | 6/1978 | Darrel ..................... 324/547 X |
| 4,191,921 | 3/1980 | Yoshino ................. 324/547 |
| 4,245,187 | 1/1981 | Wagner ................. 324/547 X |
| 4,929,903 | 5/1990 | Saigo et al. ........... 324/544 |
| 4,952,880 | 8/1990 | Clinton ................. 324/544 |

OTHER PUBLICATIONS

A. Tam, Principles of Microstrip Design, RF Design, pp. 29-34, Jun. 1988.

Primary Examiner—Gerard R. Strecker
Assistant Examiner—Diep Do
Attorney, Agent, or Firm—Ronald E. Champion; Arnold L. Albin

[57] ABSTRACT

An apparatus for providing a quantitative measurement of high frequency corona discharges from electrical devices operating at high voltages, including an alternating current power source for providing a test signal variable in amplitude and frequency, a high pass filter to reject power source cyclical components and to isolate corona discharge components, an adjustable gain amplifier, and a power meter providing a quantitative readout of the amplitude of corona discharges integrated over a preselected time period. Electromagnetic shielding of individual assemblies comprising the test equipment allows corona detection without emissions or interference from external sources.

10 Claims, 4 Drawing Sheets

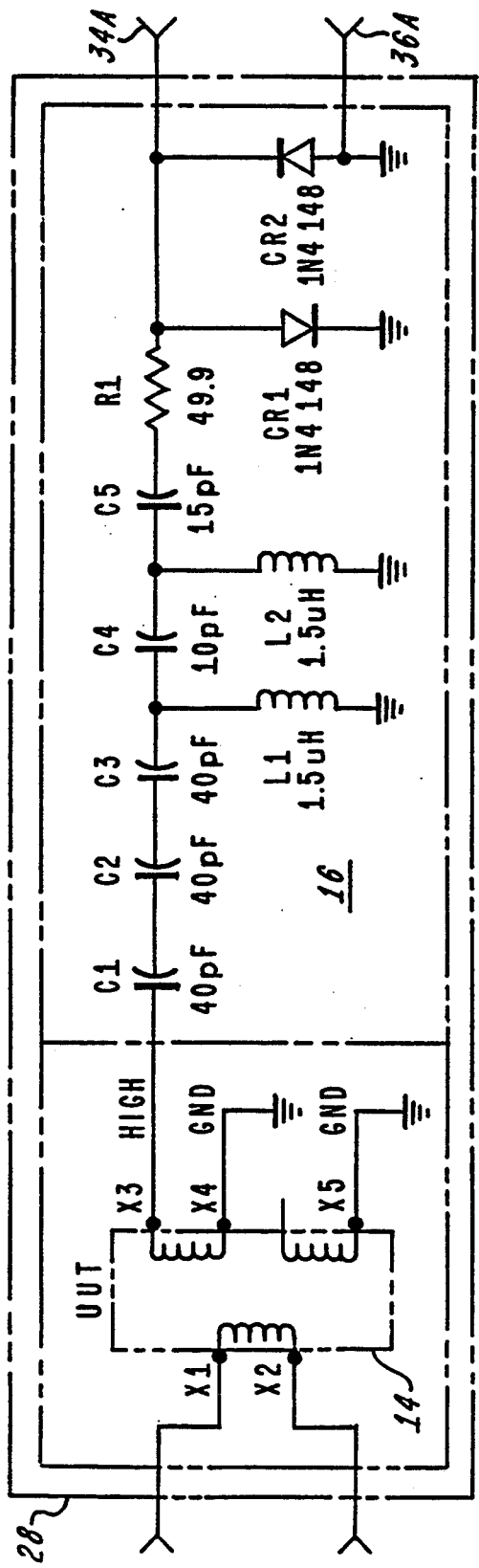
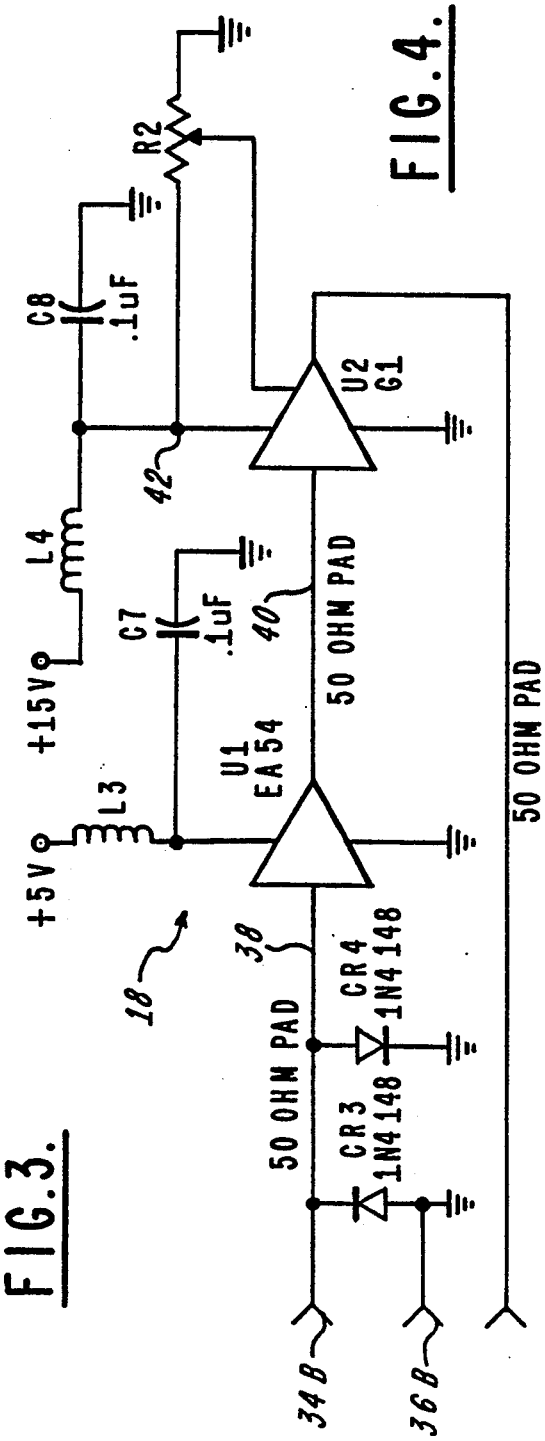
FIG. 3.
FIG. 4.

APPARATUS FOR MEASUREMENT OF HIGH FREQUENCY CORONA DISCHARGES IN ELECTRICAL COMPONENTS

BACKGROUND OF THE INVENTION

1. Field of the Invention

The invention relates in general to detection and measurement of corona discharges in electrical devices and, more particularly, to quantitative measurement of high frequency corona discharges in flyback transformers for high voltage supplies.

2. Description of the Prior Art

Electrical components operating at high voltages, such as flyback transformers and power supply filter capacitors, isolation transformers, and dielectric materials are usually subjected to a high voltage test prior to use to detect any insulation or structural defects which may lead to corona discharge at operating voltages and frequencies. Intense corona activity within the device will lead to early failure.

A corona discharge has been defined as a type localized discharge resulting from transient gaseous ionization in an insulation system when the voltage stress exceeds a critical value. The ionized gases which make up the corona discharge are highly conductive and may lead to a direct arc discharge across the device. High voltage transformers, including flyback transformers for cathode ray tube power supplies, are particularly susceptible to irregularities in construction, because of the high voltage differential between layers of the windings, and a single misplaced turn or void in encapsulation may result in catastrophic failure from corona discharge. Similarly, capacitors may suffer break down of the dielectric due to corona discharge within the capacitor.

In order to obtain a valid test under conditions which approximate the use of the electrical device in operation, it is desirable to energize the device with high voltage, preferably at a magnitude greater than and a frequency nominally close to that encountered when installed in the intended circuit. Since flyback transformers are energized by a high frequency alternating current (ac) and filter capacitors are also used in such applications, the prior art has attempted to differentiate between the excitation signal and the corona discharge signal by narrow band filters, broad band filters, and cancellation techniques.

One known method for determining the presence of corona discharge in VLF capacitors makes use of corona current signals in the 20 MHz to 50 MHz frequency range to provide a dc level proportional to corona activity. However, it has been found that significant corona activity may occur with devices above the 50 MHz range, which would not be detected by the aforesaid system. Further, no provision is made for testing devices other than in a transmitter circuit operating at VLF. This precludes varying the applied excitation voltage in amplitude or frequency to determine a corona threshold, nor does it allow for testing inductive devices.

Another apparatus for detection of corona discharge signals mixed with noise which is in synchronism with a cycle of a power supply, such as occurs in a flyback transformer of a television receiver, converts the noise and corona signal to a digital signal and subtracts one from the other to provide a resulting digital signal which is converted to an analog signal for observation. This apparatus requires a complex circuit for signal processing to assure phase cancellation of the driving signal.

One difficulty in common with prior art systems is their susceptibility to external electromagnetic radiation sources, which may require the use of a shielded room to preclude errors introduced from such signals. Further, high voltage testing itself produces high levels of radio-frequency interference, which is inimicable to operation in a laboratory or test environment.

The present invention utilizes a modular shielded construction which obviates the need for a shielded room. It provides an alternating current power source variable in frequency and amplitude so that the threshold of frequency dependent corona breakdown in a unit under test can be determined. An absolute power measurement is made by integrating the corona discharge signal over an extended frequency band, so that critical high frequency corona components are included in the measurement. Off-the-shelf devices comprise a substantial portion of the test apparatus, minimizing the need for fabrication of complex, special purpose circuits.

SUMMARY OF THE INVENTION

The present invention is directed to an apparatus for detecting and quantitatively measuring corona discharges in an energized electrical device. It comprises a function generator for producing an alternating current test signal for transmission to the electrical device, the function generator further being variable in frequency and amplitude for operation at a resonant frequency and preferably greater than normal operating voltage of the electrical device, a power amplifier, coupled to the function generator for providing an augmented alternating current test signal, a shielded housing for enclosing the electrical device so as substantially to preclude entry or emission of electro-magnetic radiation, a shielded high pass filter having a predetermined frequency response for substantially rejecting the alternating current test signal and its harmonics in order to isolate the corona discharges emanating from the electrical device under test from the test signal, the filter being coupled to an electrical output of the electrical device under test, power measurement means coupled to the high pass filter for measuring the magnitude of the corona discharges substantially unrestricted over the pass band of the filter, for averaging the magnitude of corona discharges over a preset period and for generating a signal representative thereof, means for displaying the averaged signal to provide a quantitative indication of the corona discharge emissions from the electrical device, and alternating current measurement means coupled to a power input of the power amplifier for providing a measurement of the alternating current input to the amplifier, a minimum amplitude of the alternating current input being indicative of a resonant frequency of the electrical device as the alternating current test signal is varied in frequency.

BRIEF DESCRIPTION OF THE DRAWINGS

FIG. 3 is a circuit diagram of a high pass filter as utilized in a preferred embodiment of the present invention.

FIG. 4 is a circuit diagram of a gain amplifier as utilized in a preferred embodiment of the present invention.

DESCRIPTION OF THE PREFERRED EMBODIMENT

Figure 1:
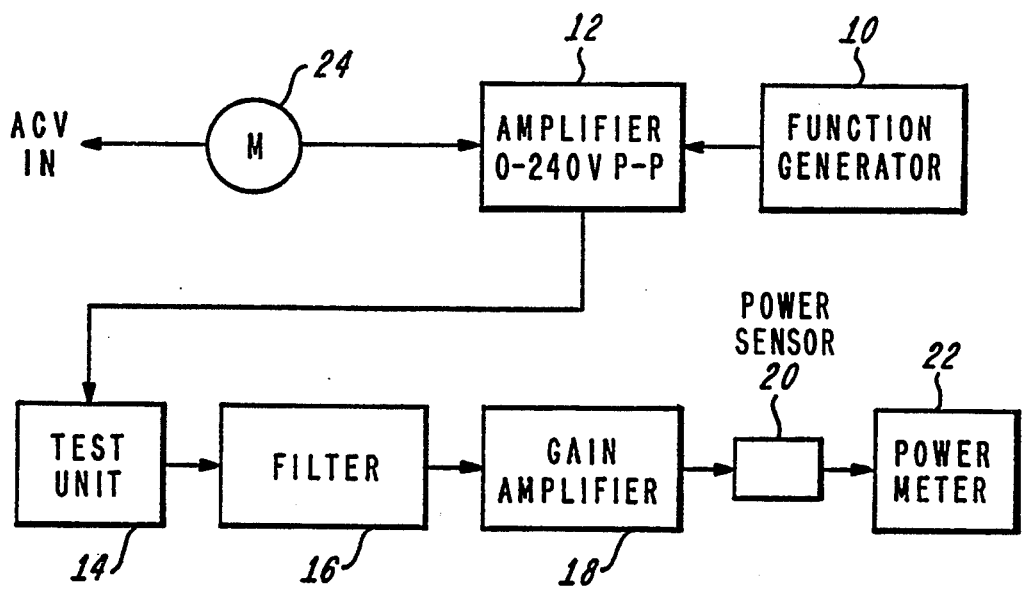
FIG. 1 is a block diagram illustrating the overall configuration of the invention.

Referring now to FIG. 1 there is shown a block diagram including a function generator 10 driving an amplifier 12. Amplifier 12 receives power from a conventional AC line voltage source through an ammeter 24. Ammeter 24 may be incorporated in instrument housing 32 for convenience in testing. The output of amplifier 12 is applied to supply the excitation voltage to a unit under test 14, which may be a high voltage electrical device such as a flyback transformer, a voltage converter transformer for a DC/DC supply, a capacitor, or other component employed substantially in high voltage applications.

Test unit 14 has an output coupled to a high pass filter 16 whose output is amplified by gain amplifier 18 to a level suitable for detection by power sensor 20. Power sensor 20 is coupled to power meter 22 to provide a measurement of corona discharge power.

Figure 2:
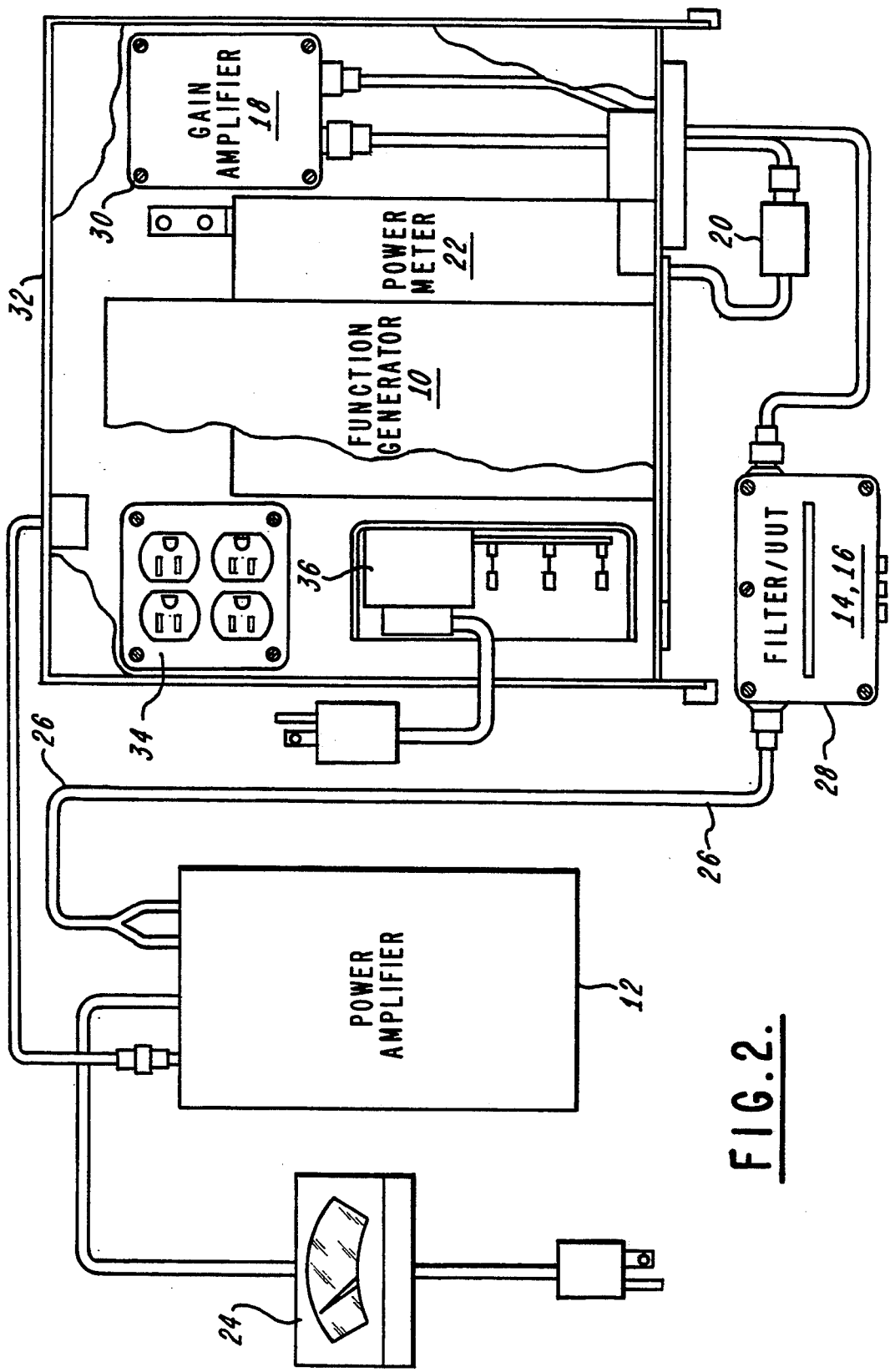
FIG. 2 is a pictorial in partial section showing the mechanical layout of the invention.

Referring to FIG. 2, a preferred embodiment which provides shielding isolation from the environment is shown. The unit under test 14 and high pass filter 16 are housed within separately shielded compartments with a housing 28. High pass filter 16 is preferably fabricated as will be described with respect to FIG. 3. Conventional shielding techniques are well known, and include the use of conductive gaskets or spring fingers at joints, as required, conductive finishes, and shielded interconnecting cables. Power supply leads are also filtered to decouple the corona discharge energy from the outside supply.

Figure 7:
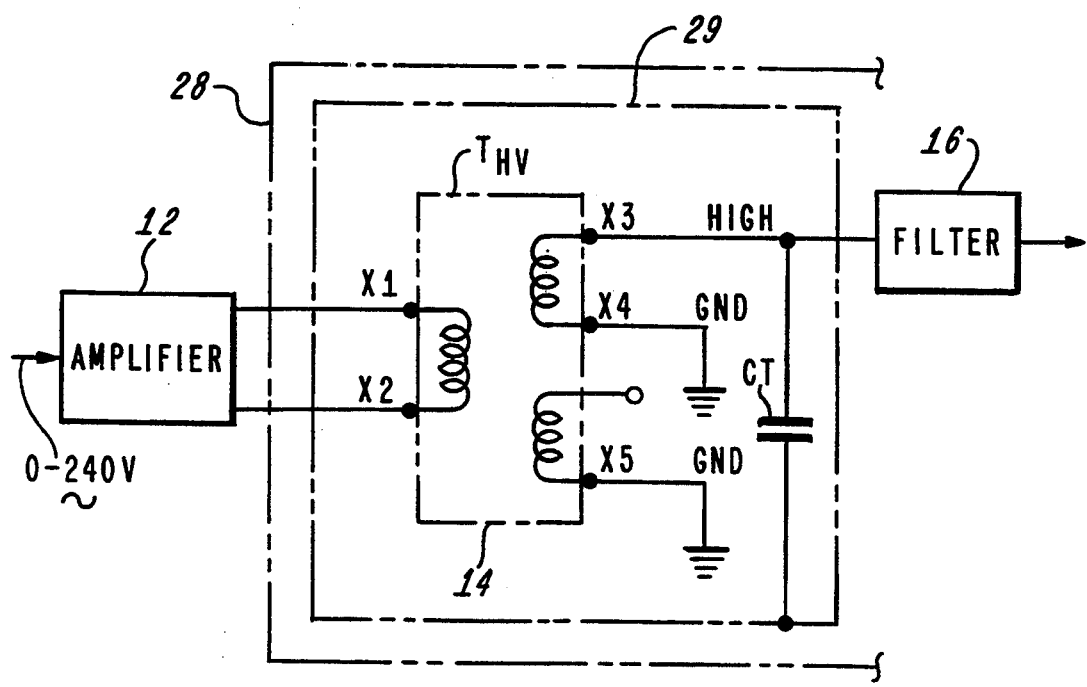
FIG. 7 is a schematic circuit diagram showing excitation of a capacitor under test by a corona-free high voltage transformer.

Other components to be exposed to high voltages in operation, such as capacitors, may be tested by providing excitation from a corona-free high voltage transformer. As shown in FIG. 7, a shielded transformer $T_{HV}$ provides a high voltage output to a capacitor $C_T$, the transformer and capacitor being enclosed in a further shielded enclosure 29 to precluded stray emissions from bypassing filter 16.

An instrument housing 32, which may be an enclosed rack and panel assembly, provides support for the shielded gain amplifier 18, power meter 22, function generator 10, AC power receptacles 34 and control relay 36, and control switches on the front panel (not shown). Gain amplifier 18 is constructed as will be described with respect to FIG. 4 and FIG. 5. Function generator 10 may be a commercially available generator such as Hewlett Packard Model 8111A, but other generator capable of providing up to 1.4 V rms into a 50 Ohm load at up to 100 KHz are suitable. Power meter 22 preferably comprises a Hewlett Packard Model 437B and utilizes sensor 20, which may be Hewlett Packard Model HP8481A. It is essential that any sensor and power meter provide a broad band response with a sensitivity of the order of −30 dbm up to 250 MHz, and be adequately shielded and filtered to reduce unwanted electromagnetic emissions and susceptiblity. Amplifier 12 is a high power, wide dynamic range device. As used with the present invention, Mcintosh Model MC 2600 power amplifier provides up to 1200 watts output at low distortion over the range of 20 Hz to 20 Khz, and has been found to be operable up to about 200 KHz at somewhat higher distortion or lower power levels.

FIG. 3 shows a typical interconnection between a high voltage transformer under test 14 and high pass filter 16, and further describes the structure of filter 16. Transformer 14 has a primary winding with terminals X1 and X2 fed by corresponding output leads from amplifier 12. Note that transformer 14 and filter 16 are independently shielded to avoid mutual coupling from the corona discharge, which could otherwise bypass filter 16 and provide erroneous readings. An output winding of transformer 14 has a terminal X3 connected to series capacitor C1 and terminal X4 grounded to complete the secondary circuit.

Referring now to filter 16, capacitors C1, C2 and C3 provide high voltage isolation from transformer 14. In operation, with a given transformer, 220 V applied to terminals X1 and X2 will result in up to 15,000 V at terminals X3 and X4. The series connection of the capacitors acts as a voltage divider to reduce the stress applied to each capacitor. Capacitor C3 is coupled to a shunt inductor L1 and a series capacitor C4. Capacitor C4 in turn is coupled to shunt inductor L2 and a further series capacitor C5. Series resistor R1 connected to the output terminal of capacitor C5 assures an appropriate impedance match to a 50 ohm system. Diodes CR1 and CR2 form no part of the frequency determining components, but act to protect against a breakdown of the filter components, which could result in excessive potential being applied to the gain amplifier 18.

Referring now to FIG. 4, a circuit for gain amplifier 18 is shown. Terminal 34A and 36B of filter 16 connect respectively to terminals 34B and 36B of gain amplifier 18. Diodes CR3 and CR4 are connected across the high side of the amplifier input and ground to provide protection against voltage spikes, as previously described with respect to filter 16. The filtered signal at terminal 34B is applied on lead 38 to the signal input of amplifier U1. Amplifier U1 is a commercially available component, such as part No. WJ-A54 as manufactured by Watkins-Johnson Co. It is operative over a frequency range of 5–400 MHz and provides a power output of the order of 6–8 dBm and a small signal gain of 26.0 dB. It is powered through isolating inductor L3 from a +5 V dc supply (not shown). Inductor L3 is bypassed to ground by capacitor C7 at the connection to amplifier U1. The output of amplifier U1 on lead 40 is applied to voltage-controlled attenuator U2, available as part No. WJ-G1 from Watkins-Johnson Co. Attenuator U2 provides an attenuation up to 36 dB over the frequency range of interest. A +15 V dc supply is coupled through inductor L4 to attenuator U2 and adjustable resistor R2. Junction 42 of resistor R2 and attenuator U2 is bypassed by a capacitor C8. Adjustable resistor R2 is terminated to ground and the variable arm connects to a control electrode of attenuator U2.

Figure 5:
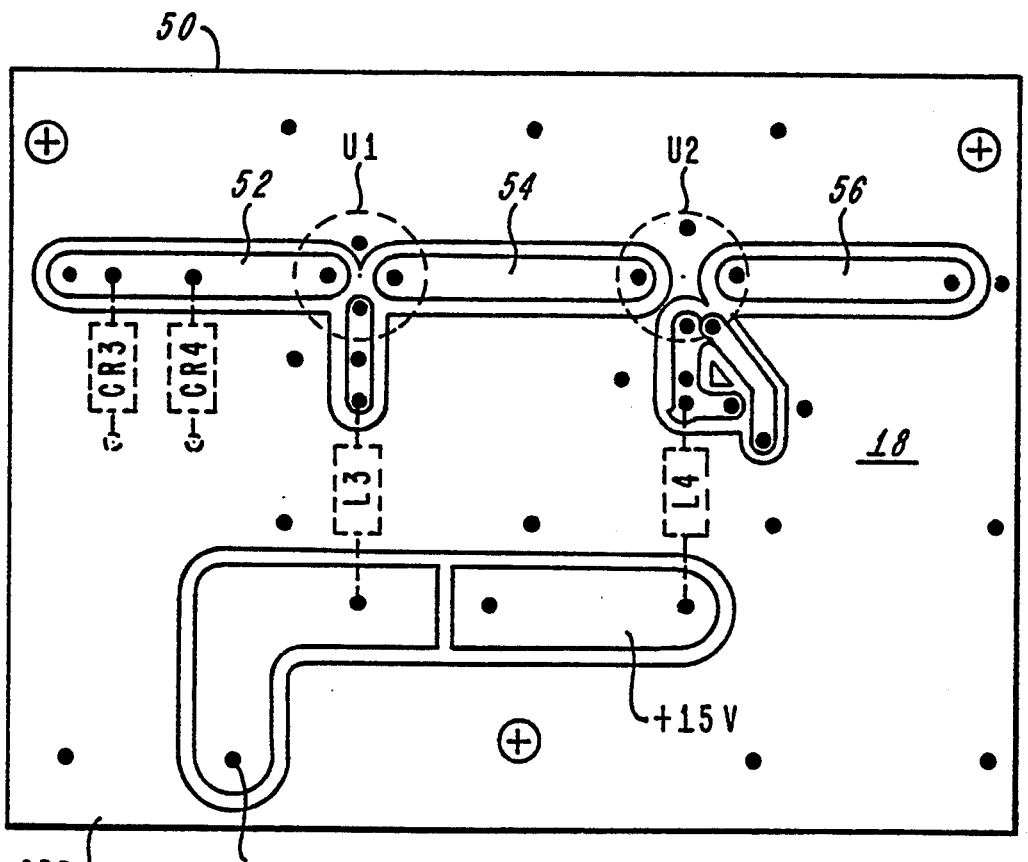
FIG. 5 is a plan view of a printed circuit board as in the present invention, showing the impedance matching conductive traces.

Amplifier 18 is constructed on a printed circuit board 50, as shown in FIG. 5. For clarity and ease of understanding the invention, selected components are shown in phantom view. The printed circuit board is provided with traces 52, 54 and 56 whose width-to-height ratio and thickness and dielectric constant of the substrate are chosen in a manner well known to those skilled in the art to provide a 50 Ohm impedance match to the input filter, output power sensor, and interconnection between elements U1 and U2. By matching the impedance characteristics over the pass band maximum power transfer is achieved while minimizing distortion of the corona discharge signal. The design of such microstrip circuit boards is found, for example, in A. Tam, Principles of Microstrip Design, RF Design, pp 29-34, June 1988.

Figure 6:
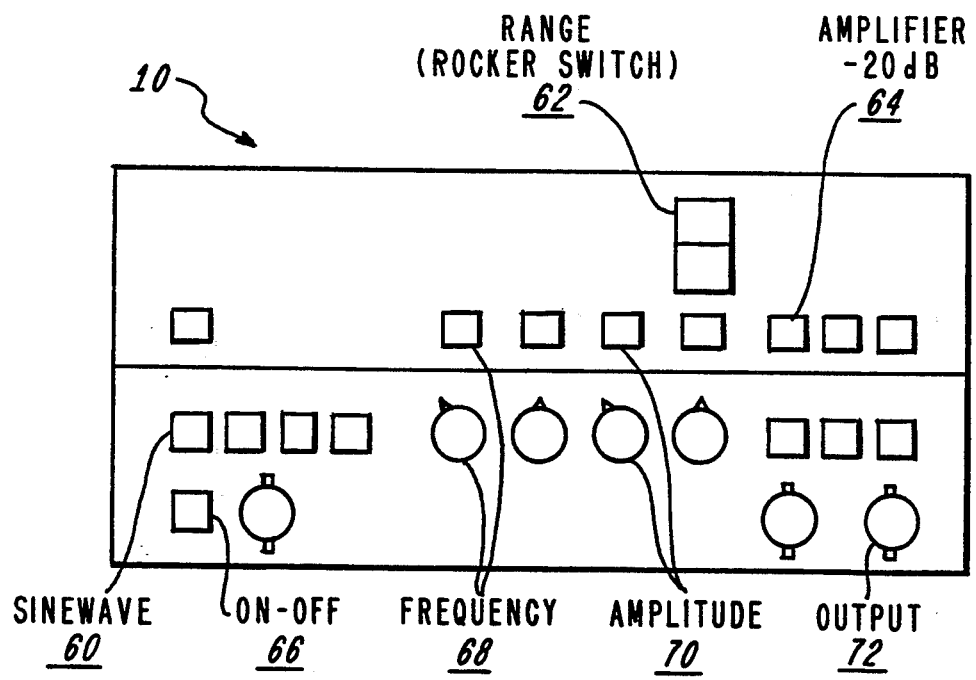
FIG. 6 is a view of the control panel of the function generator of FIG. 1.

During operation of the system shown in FIG. 1, the unit under test is wired to a subbase within the shielded enclosure, which may be partially filled with a dielectric oil to preclude arcing at the terminals due to exposure to the air. Function generator 10 is activated to supply a suitable driving signal, which may be a sine wave, sawtooth, square wave, or other waveshape simulating the waveform of the power supply with which the test unit is to be employed. FIG. 6 shows a conceptual view of a commercial function generator provided with control functions for selecting waveform 60, frequency or width parameters 62, amplitude 64, power on/off 66, frequency 68, amplitude 70 and output connector 72. Generator 10 drives amplifier 12 to provide an output as high as 240 V p—p, as required to induce corona discharge or qualify the test unit as acceptable. The applied operating voltage should be at least equal to the normal operating voltage and preferably greater than the normal operating voltage to provide a margin of safety and improved reliability. The AC power current supply to amplifier 12 is monitored by ammeter 24 as the function generator is varied in frequency. At or near the resonant frequency of the transformer, a minimum current is drawn by amplifier 12 due to maximizing the input impedance of test unit 14. Thus, this minimum determines an optimum operating point, and quantifies the resonant frequency. High pass filter 16 allows corona discharge components over substantially the frequency range of 10–250 MHz to pass to gain amplifier 18, after which they are applied to sensor 20 to provide a measure of the instantaneous corona discharge power. The output signal representative of the corona discharge in the device being tested is coupled to power meter 22, where it is generally amplified, averaged over a preset interval, and transmitted to a detector to provide a visual indication of the magnitude of the corona discharge. Since power meter 22 is calibrated in absolute terms, a quantitative readout of the discharge power in dBm is readily obtained.

While the invention has been described in its preferred embodiments, it is to be understood that the words which have been used are words of description rather than limitation and that changes may be made within the purview of the appended claims without departing from the true scope and spirit of the invention in its broader aspects.

Embodiments of an invention in which an exclusive property or right is claimed are defined as follows:

1. Apparatus for detecting and quantatively measuring corona discharges in an energized electrical device, comprising:
function generator means for producing an alternating current test signal for transmission to said electrical device, said function generator means further provided with means for varying said test signal in frequency and amplitude for operation at substantially a resonant frequency characterized by a predetermined impedance to said test signal and at least a normal operating voltage of said electrical device,
a power amplifier, coupled to said function generator means for providing an augmented alternating current test signal,
a shielded housing for enclosing said electrical device so as substantially to preclude entry or emission of electro-magnetic radiation,
a shielded high pass filter having a predetermined frequency response for substantially rejecting said alternating current test signal and its harmonic components so as to provide an output signal comprised only of said corona discharges, said filter being coupled to an electrical output of said electrical device,
power measurement means coupled to said high pass filter for measuring the magnitude of said corona discharges substantially unrestricted over the pass band of said filter, for averaging said magnitude of corona discharges over a preset period and for generating a signal representative thereof,
means for displaying said averaged signal to provide a quantitative indication of the corona discharge emissions from said electrical device, and
alternating current measurement means coupled to a power input of said power amplifier for providing a measurement of the current input to said amplifier, a minimum of said current input being indicative of a resonant frequency of said electrical device as said alternating current test signal is varied in frequency.

2. Apparatus as set forth in claim 1, wherein said high pass filter is operative over a pass band substantially from 20 MHz to 250 MHz.

3. Apparatus as set forth in claim 2, wherein said means for producing an alternating current test signal produces a sinusoidal waveform.

4. Apparatus as set forth in claim 3, further comprising gain means coupled intermediate said high pass filter and said power measurement means for providing a corona signal augmented in amplitude.

5. Apparatus as set forth in claim 4, wherein said power measurement means comprises a power sensor coupled intermediate said gain means and said means for displaying, for providing an instantaneous measure of the amplitude of said corona output signal.

6. Apparatus as set forth in claim 4, wherein said gain means is provided with an input and an output and said gain means is adapted at said input and output to match impedances of said filter and said power sensor, thereby to provide substantially distortionless transmission of the pulse response characteristics of the high frequency corona discharge band to said sensor.

7. The apparatus as set forth in claim 6, wherein said gain amplifier is constructed on a printed circuit board having a predetermined dielectric constant and said input and output is comprised of a plurality of conductive traces having a predetermined width-to-height ratio.

8. Apparatus for the corona testing of electrical insulation of an electrical device, comprising:
means for subjecting said electrical device to a source of sufficiently high electrical stress so as to cause corona discharge in defective portions of the insulation, a high pass filter, responsive to high frequency emanations resulting from said corona discharge while substantially attenuating low frequency emanations from said source of electrical stress, a first indicating device coupled to an output of said high pass filter for providing a averaged power indication of said high frequency emanations, a second indicating device coupled to the source of electrical stress for providing an indication of a state of a minimum power consumption as a function of varying an electrical parameter of said source of electrical stress, means for varying said parameter as a function of frequency so as to establish said corona discharge at an optimum point of operation of said electrical device characterized by said state of minimum power consumption, and means for independently shielding at least said electrical device and said filter for substantially reducing high frequency disturbances to or from the surrounding area.

9. Apparatus as set forth in claim 8, wherein said means for subjecting an electrical device to electrical stress comprises a corona-free high voltage transformer coupled to a source of excitation variable in frequency and amplitude, and said electrical device comprises a capacitor.

10. A method for corona testing a flyback transformer, comprising, providing a shielded enclosure for said flyback transformer, coupling an input of said flyback transformer to a source of electrical excitation sufficient to cause corona discharge in said transformer at a nominal operating frequency thereof, coupling an output of said flyback transformer to a shielded high pass filter having a bandpass substantially from 50 to 250 Mhz for substantially rejecting the source of electrical excitation at the excitation frequency and its harmonics, coupling said high pass filter to a shielded gain amplifier, said gain amplifier having printed circuit board traces integrally constructed to provide matching impedances at an input and an output thereof, applying the output of said gain amplifier to a power indicator for averaging the instantaneous corona discharge emanations over a preset interval to provide a measured power output in analog form, applying a power source to said source of electrical excitation through a further indicator for providing an indication of a resonant operating frequency of said transformer as the frequency of said source of electrical excitation is varied about said nominal operating frequency, and reading said averaged power output at said resonant frequency.

* * * * *